United States Patent
Chung et al.

(10) Patent No.: US 12,000,907 B2
(45) Date of Patent: Jun. 4, 2024

(54) SYSTEM, DEVICE AND METHOD FOR DETECTING CONNECTION OF CONNECTING STRUCTURE

(71) Applicant: NAVER LABS CORPORATION, Seongnam-si (KR)

(72) Inventors: Sungyong Chung, Seongnam-si (KR); Jaeryang Lee, Seongnam-si (JP); Eungyo Jung, Seongnam-si (KR); Seong-jun Lee, Seongnam-si (KR); Junghoon Cheon, Seongnam-si (KR); Joonseo Park, Seongnam-si (KR)

(73) Assignee: NAVER LABS CORPORATION, Seongnam-si (KR)

( * ) Notice: Subject to any disclaimer, the term of this patent is extended or adjusted under 35 U.S.C. 154(b) by 0 days.

(21) Appl. No.: 17/817,432

(22) Filed: Aug. 4, 2022

(65) Prior Publication Data
US 2022/0373616 A1 Nov. 24, 2022

Related U.S. Application Data

(63) Continuation of application No. PCT/KR2020/018785, filed on Dec. 21, 2020.

(30) Foreign Application Priority Data

Feb. 4, 2020 (KR) ........................ 10-2020-0013147

(51) Int. Cl.
*G01R 31/66* (2020.01)
*G01R 23/02* (2006.01)
*H03K 5/26* (2006.01)

(52) U.S. Cl.
CPC ............. *G01R 31/66* (2020.01); *G01R 23/02* (2013.01); *H03K 5/26* (2013.01)

(58) Field of Classification Search
CPC .... G01R 31/66; G01R 23/02; G01R 31/2837; G01R 31/54; G01R 31/68; G01R 1/203;
(Continued)

(56) References Cited

U.S. PATENT DOCUMENTS

| 5,895,989 A | 4/1999 | Imaizumi et al. |
| 8,817,509 B2 * | 8/2014 | Taniguchi ......... H02M 3/33561 363/165 |

(Continued)

FOREIGN PATENT DOCUMENTS

| JP | 2006043348 A | 2/2006 |
| JP | 2017004404 A | 1/2017 |

(Continued)

OTHER PUBLICATIONS

ISR issued in PCT/KR2020/018785 dated Apr. 9, 2021.
(Continued)

*Primary Examiner* — Akm Zakaria
(74) *Attorney, Agent, or Firm* — Greer Burns & Crain Ltd.

(57) ABSTRACT

A system for detecting a connection between two devices includes a first device and a second device. The first device includes a first connection terminal and a first reactance element connected to the first connection terminal. The second device includes a second connection terminal; a first resistance element, and a first frequency generator for allowing a signal to pass through the first resistance element and be applied to the first device via the second connection terminal. The second device further includes a first comparator having both input terminals connected to both ends of the first resistance element, and comparing and outputting a signal of both ends of the first resistance element, and a first control unit for determining whether or not the first connection terminal of the first device is connected to the (Continued)

second connection terminal by means of the output signal of the first comparator.

9 Claims, 15 Drawing Sheets

(58) Field of Classification Search
CPC ........ G01R 23/15; H03K 5/26; G06F 1/1632; G06F 1/266; B25J 15/0061; B25J 15/0408
See application file for complete search history.

(56) References Cited

U.S. PATENT DOCUMENTS

| | | | |
|---|---|---|---|
| 10,539,600 B2* | 1/2020 | Hirai | ...................... G01R 27/14 |
| 2007/0047270 A1 | 3/2007 | Makino et al. | |
| 2007/0167881 A1 | 7/2007 | Takahashi | |
| 2009/0273911 A1* | 11/2009 | Bandholz | .............. G06F 13/385 361/776 |
| 2011/0181293 A1 | 7/2011 | Fichtlscherer et al. | |
| 2014/0300364 A1 | 10/2014 | Choi | |
| 2016/0146877 A1 | 5/2016 | Kesterson et al. | |
| 2018/0143931 A1 | 5/2018 | Miyaoka et al. | |
| 2018/0159426 A1* | 6/2018 | Vinciarelli | .......... H02M 3/1582 |
| 2019/0137566 A1 | 5/2019 | Ormston | |

FOREIGN PATENT DOCUMENTS

| | | |
|---|---|---|
| KR | 1020120138077 A | 12/2012 |
| KR | 1020130034147 A | 4/2013 |
| KR | 101302020 B1 | 8/2013 |
| KR | 1020140121186 A | 10/2014 |
| KR | 1020160109210 A | 9/2016 |
| KR | 1020170122483 A | 11/2017 |

OTHER PUBLICATIONS

Notice of Allowance issued in corresponding JP application No. 2022-545055, dated Jun. 27, 2023.
European Search Report issued in corresponding EP application No. 20 91 7399, dated Feb. 20, 2024.

* cited by examiner

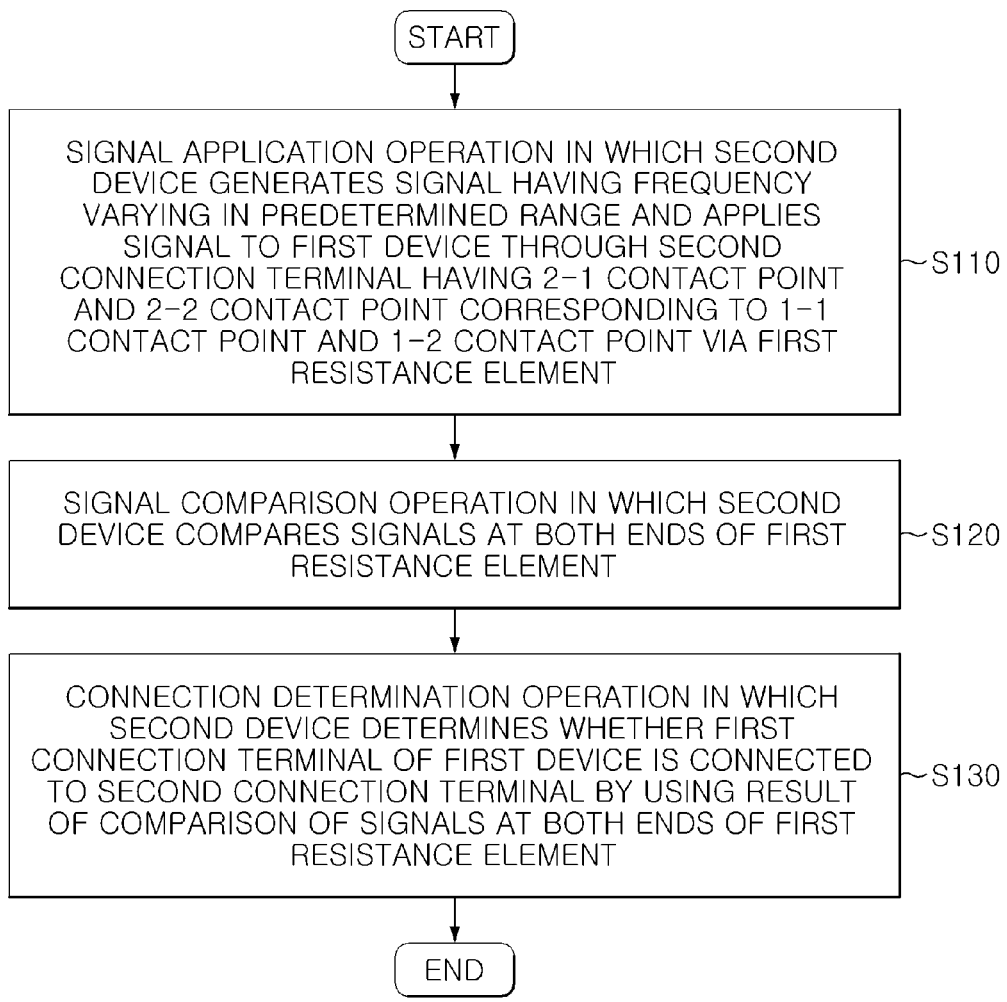

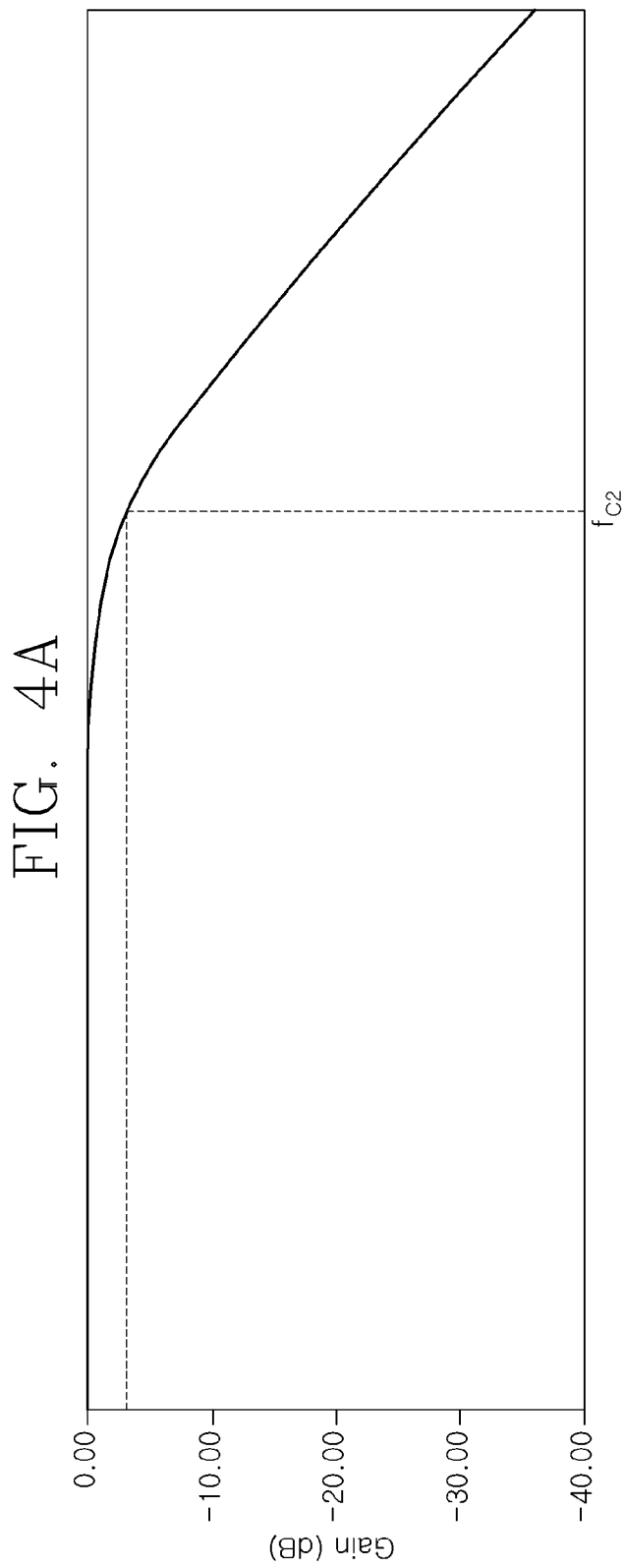

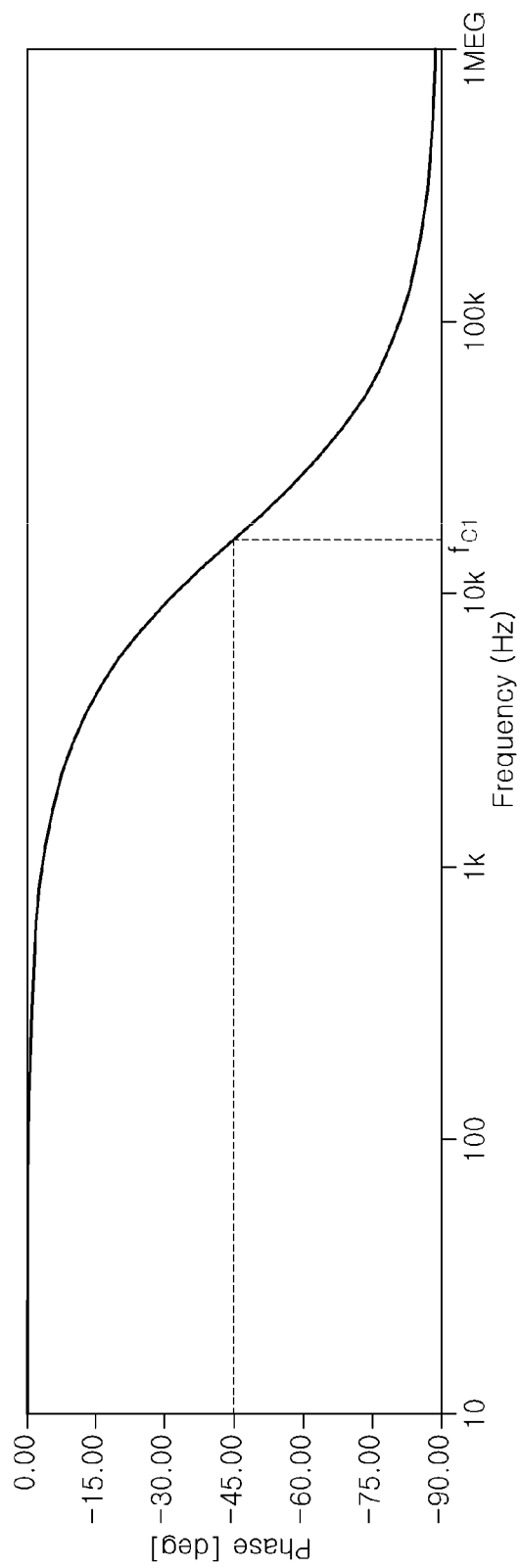

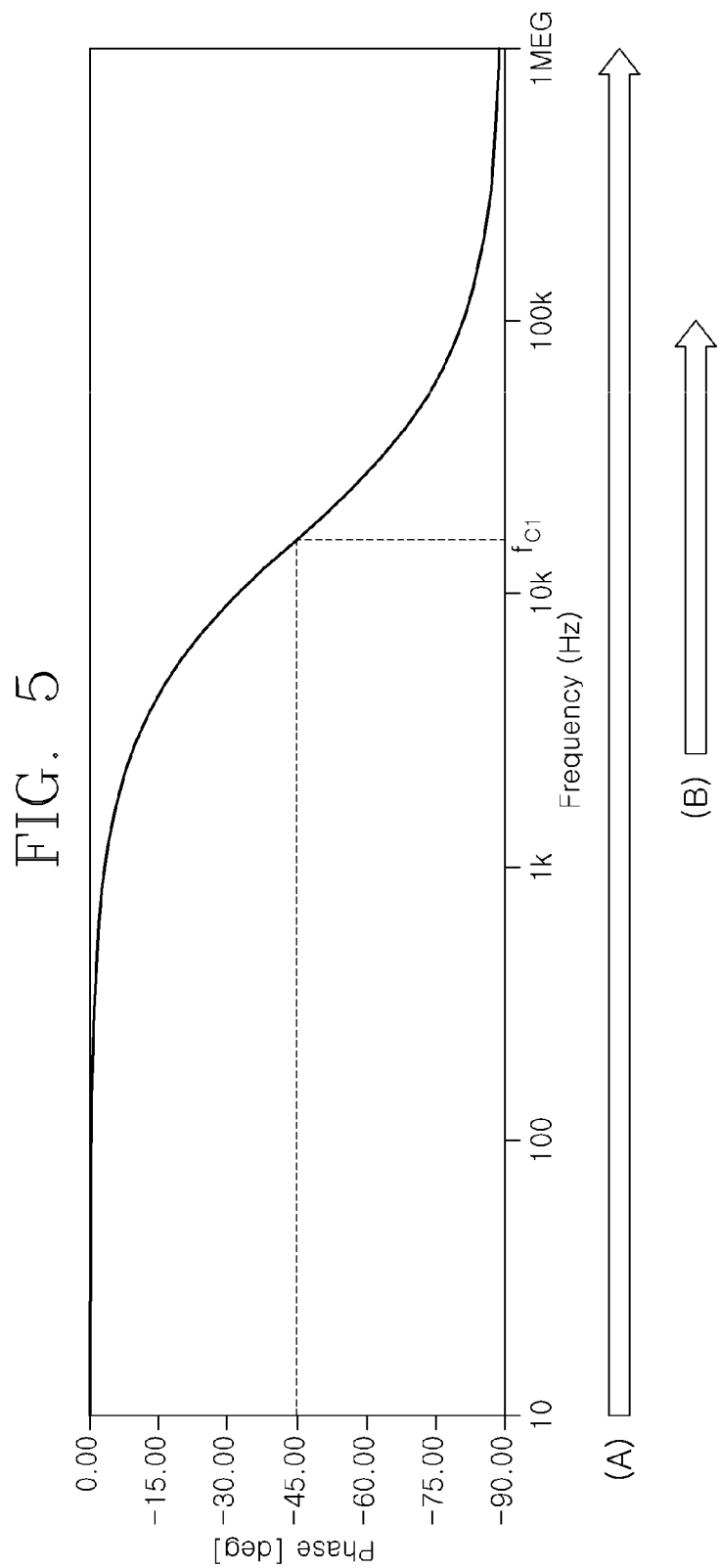

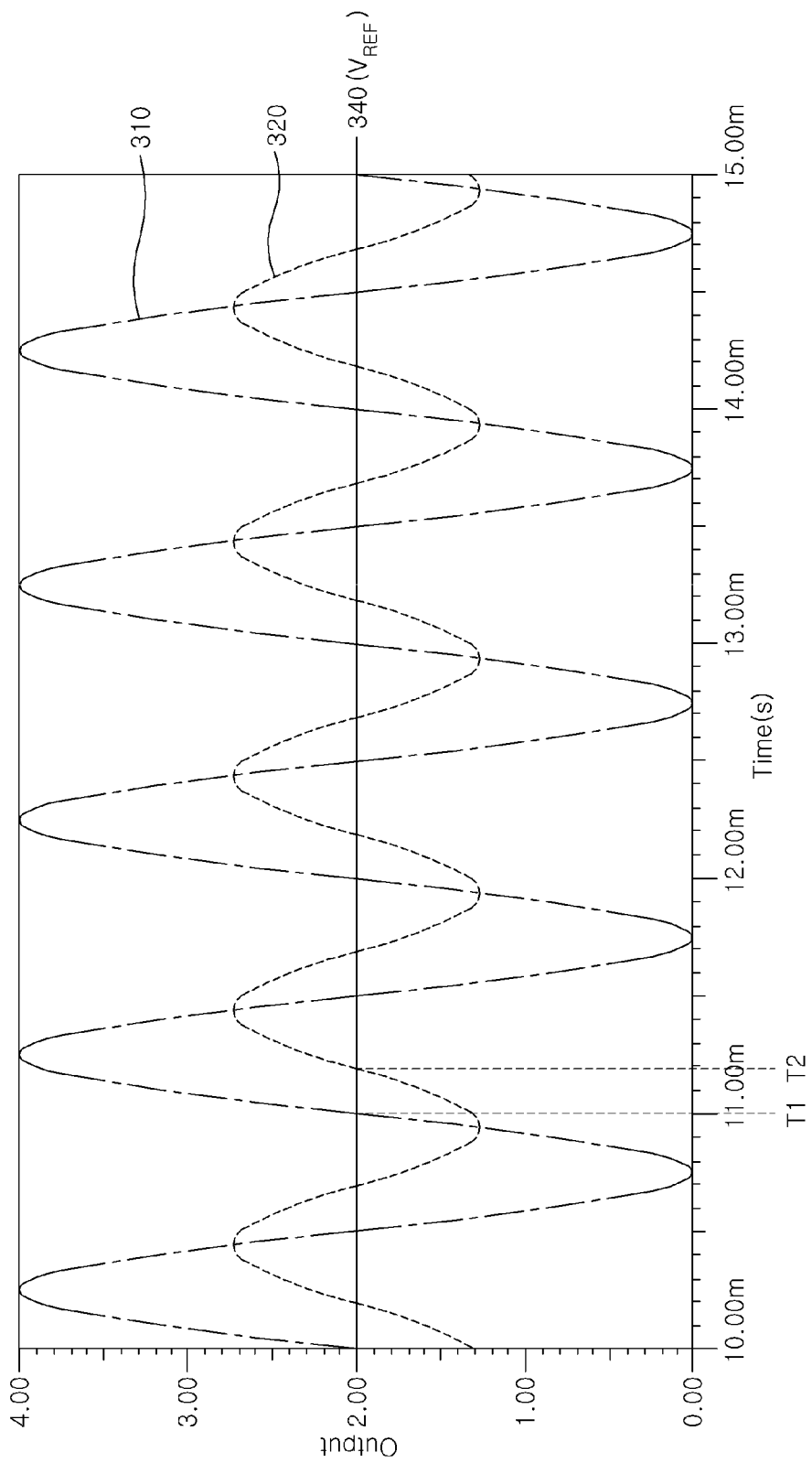

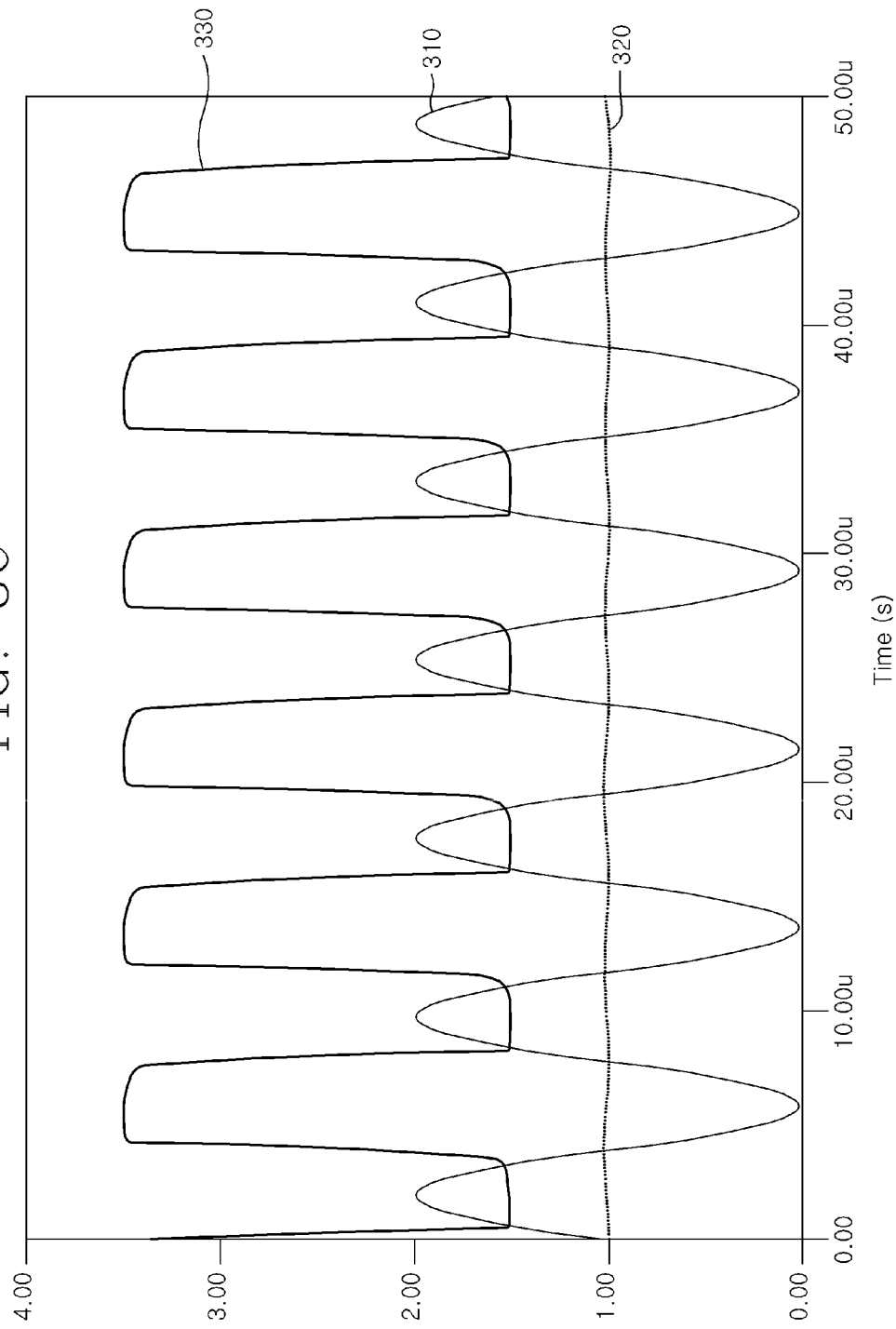

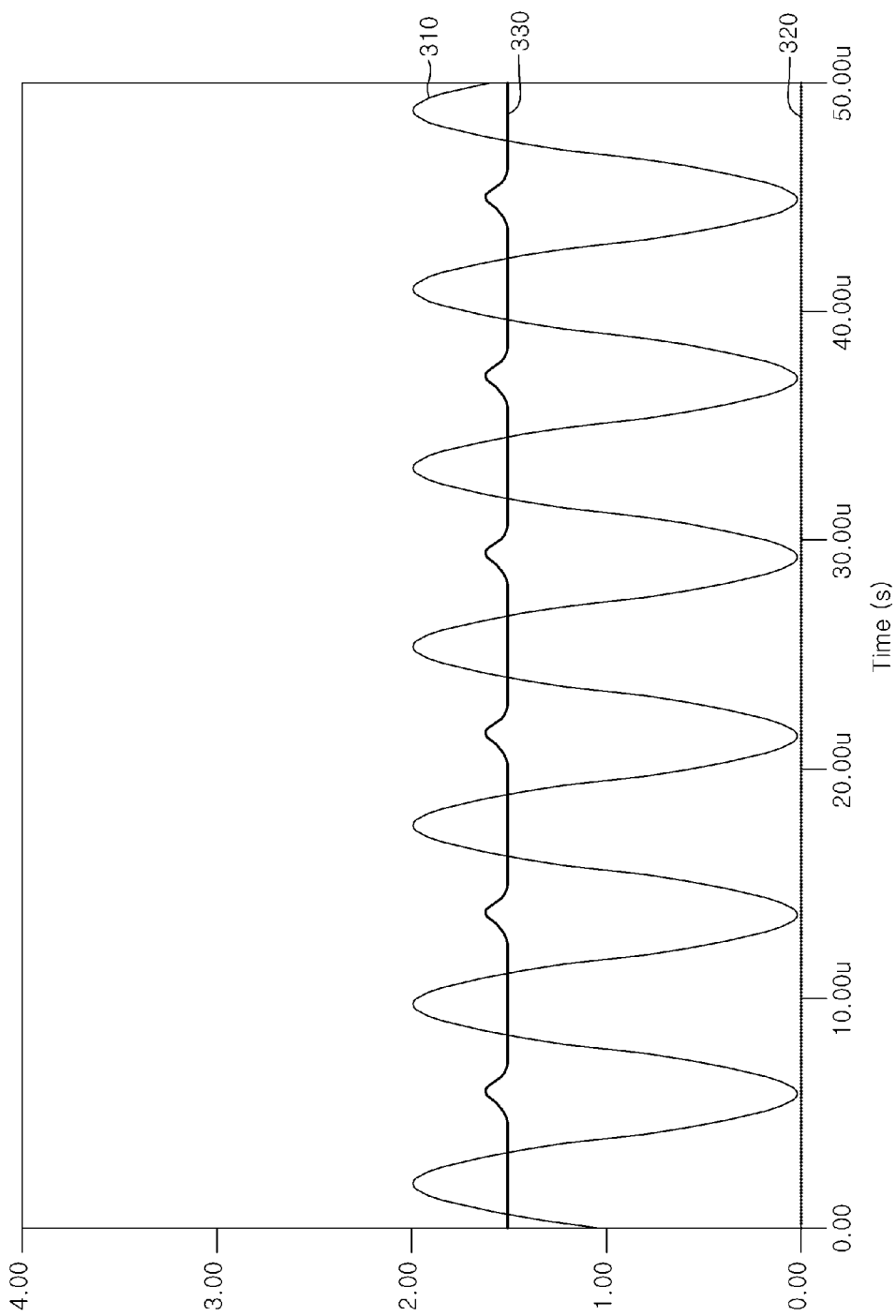

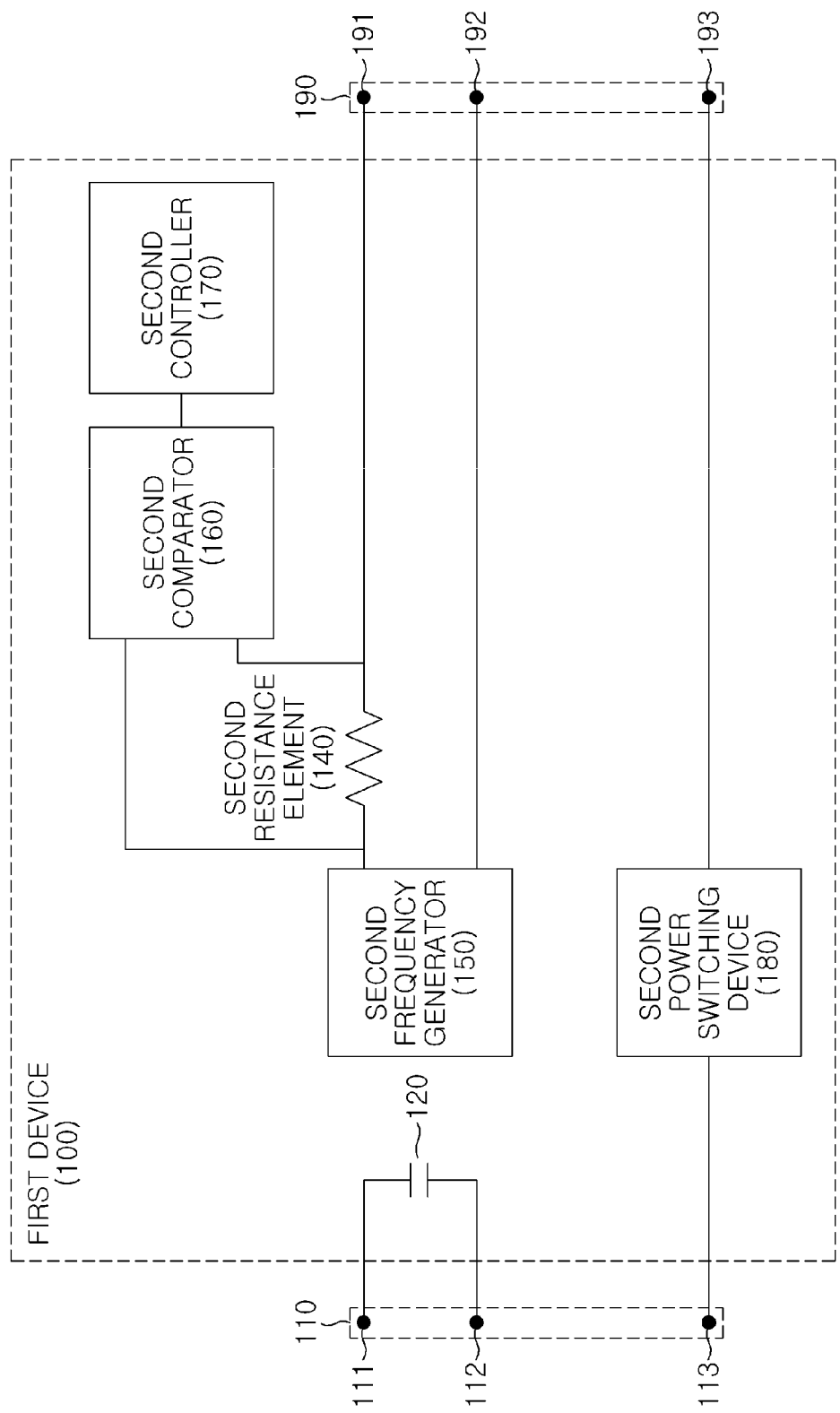

SYSTEM, DEVICE AND METHOD FOR DETECTING CONNECTION OF CONNECTING STRUCTURE

CROSS-REFERENCE TO RELATED APPLICATIONS

This is a continuation application of International Application No. PCT/KR2020/018785, filed Dec. 21, 2020, which claims the benefit of Korean Patent Application No. 10-2020-0013147, filed Feb. 4, 2020.

BACKGROUND OF THE INVENTION

Field of Invention

The disclosure relates to a system, an apparatus, and a method for detecting a connection for a connecting structure and, more particularly, to a system, an apparatus, and a method for automatically detecting the connection of a device and identifying the connected device.

Description of Related Art

Recently, applications for applying robot technologies such as logics/production automation have rapidly expanded. In connection with this, examples of applying a connection structure for attaching a slave device having various functions to a master device such as a robot body to link the slave device with the master device have increased.

Further, the connecting structure is not limited to a robot field but is widely used for various devices. However, in the conventional connecting structure, when the master device always supplies power and signals without recognizing whether the slave device is connected, noise or sparks may be generated at a connection terminal if a conductive foreign material comes into contact with the connection terminal.

A method is also known in which, when the slave device has in advance a predetermined size of resistance and the slave device is connected to the master device, a connection terminal measures the resistance of the slave device and the master device detects whether the slave device is connected. Even in this case, if a foreign material having a resistance value similar to the resistance of the slave device comes into contact with the connection terminal, a problem may occur in that it is determined erroneously as if the slave device were connected, when it is not.

Therefore, there is a need for a method by which the master device is able to accurately detect whether the slave device is attached and safely supply power and signals required for the operation of the slave device.

BRIEF SUMMARY OF THE INVENTION

The disclosure has been made to solve the problem of the conventional art, and an aspect of the disclosure is to allow a master device to accurately detect whether a slave device is attached and safely supply power and signals required for the operation of the slave device.

Another aspect of the disclosure is to allow the master device to identify the slave device and permit the connection for only the slave device allowed to be attached.

Other detailed aspects of the disclosure may be clearly detected and understood by those skilled in the art through the following detailed description.

In accordance with an aspect of the disclosure, a system for detecting a connection includes: a first device including a first connection terminal having a 1-1 contact point and a 1-2 contact point, and a first reactance element connected to the first connection terminal; and a second device including a second connection terminal having a 2-1 contact point and a 2-2 contact point corresponding to the 1-1 contact point and the 1-2 contact point, a first resistance element, a first frequency generator configured to apply a signal having a frequency varying a predetermined range to the first device through the second connection terminal via the first resistance element, a first comparator having both input terminals connected to both ends of the first resistance element and configured to compare and output signals at both ends of the first resistance element, and a first controller configured to determine whether the first connection terminal is connected to the second connection terminal by using an output signal of the first comparator.

In accordance with another aspect of the disclosure, an apparatus for detecting a connection detects whether there is a connection with a first device, the first device including a first connection terminal having a 1-1 contact point and a 1-2 contact point, and a first reactance element connected to the first connection terminal. The apparatus includes a second connection terminal having a 2-1 contact point and a 2-2 contact point corresponding to the 1-1 contact point and the 1-2 contact point, a first resistance element, a first frequency generator configured to apply a signal having a frequency varying in a predetermined range to the first device through the second connection terminal via the first resistance element, a first comparator having both input ends connected to both ends of the first resistance element and configured to compare and output signals at both ends of the first resistance element, and a first controller configured to determine whether the first connection terminal of the first device is connected to the second connection terminal by using an output signal of the first comparator.

In accordance with another aspect of the disclosure, a method of detecting a connection detects whether there is a connection with a first device, the first device including a first connection terminal having a 1-1 contact point and a 1-2 contact point and a first reactance element connected to the first connection terminal. The method includes: a signal application step of generating a signal having a frequency varying in a predetermined range and applying the signal to the first device through a second connection terminal having a 2-1 contact point and a 2-2 contact point corresponding to the 1-1 contact point and the 1-2 contact point via a first resistance element by the second device; a signal comparison step of comparing signals at both ends of the first resistance element by the second device; and a connection determination step of determining whether the first connection terminal of the first device is connected to the second connection terminal by using a result of the comparison between the signals at both ends of the first resistance element by the second device.

Accordingly, in the system, the apparatus, and the method for detecting a connection according to an embodiment of the disclosure, when the first device is attached to the second device, the second device accurately detect whether the first device is attached and can safely supply power and signals required for the operation of the first device.

Further, in the system, the apparatus, and the method for detecting the connection according to an embodiment of the disclosure, the second device identifies the attached first device and can perform the connection for only the first device allowed to be attached.

BRIEF DESCRIPTION OF THE DRAWINGS

The accompanying drawings included as a part of the detailed description to help understanding of the disclosure.

FIG. 3 is a flowchart of a connection detection method according to an embodiment of the disclosure.

FIGS. 4A, 4B and 5 illustrate a detailed operation in which the connection detection system, device, and method according to an embodiment of the disclosure detect the connection of a first device.

FIG. 7 illustrates a waveform in a first implementation example of the first comparator in the connection detection system according to an embodiment of the disclosure.

FIGS. 8A to 8D illustrate a waveform in a second implementation example of the first comparator in the connection detection system according to an embodiment of the disclosure.

FIG. 9 is a schematic diagram of another embodiment of the first device in the connection detection system.

DETAILED DESCRIPTION OF THE INVENTION

The disclosure may have various modifications and various embodiments, and hereinafter, specific embodiments based on the accompanying drawings are described in detail.

The following embodiments are provided to help comprehensive understanding of a method, an apparatus, and/or a system described in the specification. However, this is only an example and the disclosure is not limited thereto.

In a description of embodiments of the disclosure, if it is determined that a detailed description of known technology related to the disclosure makes the subject of the disclosure unclear, the detailed description is omitted. The definitions of the terms should be made based on the contents throughout the specification. Terms used in the detailed description are to merely describe embodiments of the disclosure and should not be restrictive. The expression of a singular form includes meaning of a plural form unless the context clearly dictates otherwise. In the description, it should be understood that the expression such as "include" or "have" indicates characteristics, numbers, steps, operations, elements, parts, or combinations thereof but does not exclude the presence or possibility of one or more other characteristics, numbers, steps, operations, elements, parts, or combinations thereof.

Further, the terms first, second, and the like may be used to describe various elements, but the elements are not limited by the terms and are used to only distinguish one element from another element.

Hereinafter, embodiments of a system, an apparatus, and a method for detecting a connection according to an embodiment of the disclosure are sequentially described with reference to the accompanying drawings.

Figure 1:
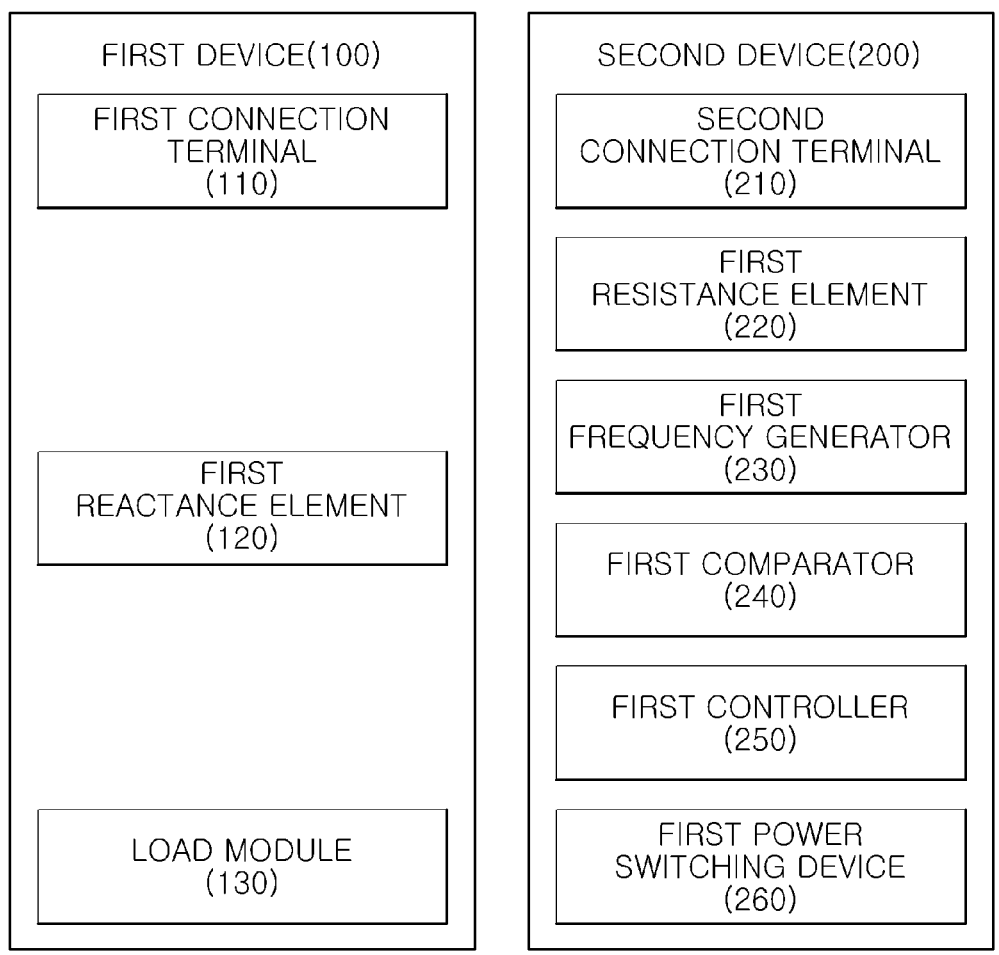
FIG. 1 is a block diagram illustrating a connection detection system according to an embodiment of the disclosure.

First, FIG. 1 is a block diagram illustrating a configuration of a connection detection system 10 according to an embodiment of the disclosure.

As illustrated in FIG. 1, the connection detection system 10 according to an embodiment of the disclosure may include a first device 100 and a second device 200 for detecting whether the first device 100 is attached thereto.

At this time, the first device 100 may be a slave device such as a robot, and the second device 200 may be a master device to which the slave device is attached, but the disclosure is not limited thereto and may be widely applied to various applications in which one device is attached to another device.

Figure 2:
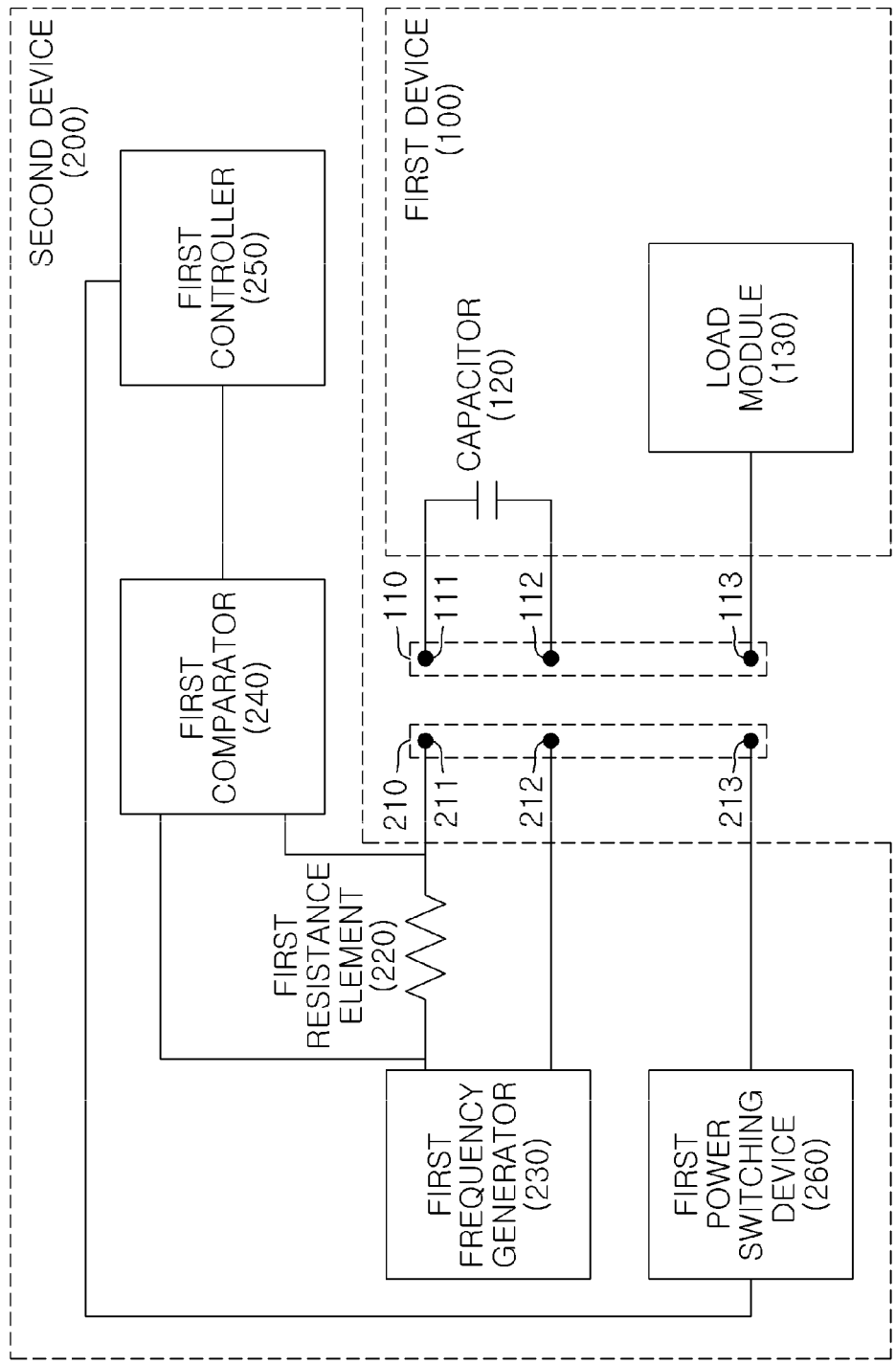
FIG. 2 is a schematic diagram of the connection detection system according to an embodiment of the disclosure.

More specifically, as illustrated in FIG. 2, the first device 100 may include a first connection terminal 110 including a 1-1 contact point 111 and a 1-2 contact point 112 and a first reactance element 120 connected to the first connection terminal 110.

Further, the second device 200 may include a second connection terminal 210 including a 2-1 contact point 211 and a 2-2 contact point 212 corresponding to the 1-1 contact point 111 and the 1-2 contact point 112, a first resistance element 220, a first frequency generator 230 configured to apply a signal having a frequency varying in a predetermined range to the first device 100 through the second connection terminal 210 via the first resistance element 220, a first comparator 240 having both input terminals connected to both ends of the first resistance element 220 and configured to compare and output signals at both ends of the first resistance element 220, and a first controller 250 configured to determine whether the first connection terminal 110 of the first device 100 is connected to the second connection terminal 210 by using the output signal of the first comparator 240.

The first comparator 240 may be a phase comparator configured to compare phases of the signals at both ends of the first resistance element 220. Accordingly, the first controller 250 may measure a first frequency (=fC1) of a phase delay between the signals at both ends of the first resistance element 220 by using the output signal of the phase comparator, the phase delay being out of a predetermined range according to an increase in the frequency of the first frequency generator 230. The first controller then determines whether the first connection terminal 110 of the first device 100 is connected to the second connection terminal 210 on the basis of the first frequency (=fC1) or an element value of the first reactance element 120 calculated using the first frequency (=fC1).

Further, the first controller 250 may measure a second frequency (=fC2) of a size change between the signals at both ends of the first resistance element 220, the size change being output a predetermined range according to an increase in the frequency of the first frequency generator 230, and then verify whether the first frequency (=fC1) is accurate by using the second frequency (=fC2).

The first connection terminal 110 may include a 1-3 contact point 113, and the second connection terminal 210 may include a 2-3 contact point 213 corresponding to the 1-3 contact point 113. Accordingly, the first controller 250 may detect the connection between the first connection terminal 110 and the second connection terminal 210 and then perform control to apply power to the first device 100 through the 2-3 contact point 213.

Further, the first frequency generator 230 can apply a signal while changing a frequency in a limited range on the basis of a predicted value of the first frequency (=fC1) according to the first reactance element 120.

Accordingly, when the first device 100 is attached to the second device 200, the second device 200 may accurately detect whether the first device 100 is connected thereto and stably supply power and signals required for the operation of the first device 100, and the second device 200 may identify the connected first device 100 and allow the connection only for the first device 100 allowed to be connected.

FIG. 3 is a flowchart illustrating a connection detection method according to an embodiment of the disclosure.

As illustrated in FIG. 3, the connection detection method may include a signal application operation S110 in which the second device 200 generates a signal having a frequency varying in a predetermined range and applies the signal to the first device 100 through the second connection terminal 210 having the 2-1 contact point 211 and the 2-2 contact point 212 corresponding to the 1-1 contact point 111 and the 1-2 contact point 112 via the first resistance element 220. In a signal comparison operation S120, the second device 200 compares signals at both ends of the first resistance element 220, and in a connection determination operation S130, the second device 200 determines whether the first connection terminal 110 of the first device 100 is connected to the second connection terminal 210 by using a result of the comparison between the signals at both ends of the first resistance element 220.

Hereinafter, the system, the apparatus, and the method for detecting the connection according to an embodiment of the disclosure are described in more detail for each element with reference to FIGS. 1 to 3.

First, in the signal application operation S110, the second device 200 may generate a signal having a frequency varying in a predetermined range and apply the signal to the first device 200 through the second connection terminal 210. More specifically, as illustrated in FIG. 2, the first frequency generator 230 of the second device 200 may generate a signal while changing frequency in a predetermined range and output the signal to the first resistance element 220. The signal passing through the first resistance element 220 may be applied to the first reactance element 120 via the 2-1 contact point 211 and the 1-1 contact point 111 and transmitted back to the first frequency generator 230 via the 1-2 contact point 112 and the 2-2 contact point 212, which configures a circuit.

As illustrated in FIG. 2, the first reactance element 120 may be configured as a capacitor but the disclosure is not necessarily limited thereto, and may be configured as an inductor, configured to include both the capacitor and the inductor, or configured to include a resistance element. Hereinafter, the case in which the first reactance element 120 is configured as a capacitor is described as an example.

Accordingly, as illustrated in FIGS. 4A and 4B, when the frequency of the signal generated by the first frequency generator 230 increases, the size of the signal is attenuated while passing through the first resistance element 220 according to the frequency response characteristic of an RC circuit and a phase is delayed.

More specifically, the frequency of a signal having the size attenuated by 3 dB or having a phase delayed by 45 degrees according to the increase in the frequency is referred to as a cut-off frequency (fc), and the cut-off frequency is determined according to an RC time constant of the circuit, and thus, if the cut-off frequency for the circuit is measured in a condition in which a resistance value of the first resistance element 220 is determined, the capacitance value of the first reactance element 120 may be calculated.

Accordingly, in an example of the disclosure, when the first frequency generator 230 generates and outputs the signal while changing the frequency, the first comparator 240 may measure the attenuation of the size of the signal or the phase delay by the first resistance element 220 according to the frequency change of the signal, and the first controller 250 may calculate the capacitance value of the first reactance element 120 by using the first frequency (=fc1) and/or the second frequency (=fc2) and then determine whether the first device 100 is attached to the second device 200 on the basis of the calculated capacitance value of the first reactance element 120. Further, it is possible to determine whether the connection is allowed by identifying the type of the attached first device 100.

According to another example, the first frequency generator 230 may generate and output the signal while changing the frequency, the first comparator 240 may measure the attenuation of the size of the signal or the phase delay by the first resistance element 220 according to the frequency change of the signal, and the first controller 250 may determine whether the first device 100 is attached to the second device 200 on the basis of the first frequency (=fc1) and/or the second frequency (=fc2). In addition, it is possible to determine whether the connection is allowed by identifying the type of the attached first device 100.

As illustrated in FIG. 5, it is possible to measure the cut-off frequency by applying signals in the entire range of frequencies which can be generated by the first frequency generator 230 (A), but the cut-off frequency can be more rapidly measured through measurement of the cut-off frequency by the first frequency generator 230 applying signals while changing the frequency in a limited range on the basis of a predicted value of the cut-off frequency according to the first reactance element 120 (FIG. 5B). The predicted value of the cut-off frequency or the limited range on the basis thereof (FIG. 5B) may be preconfigured by a user. Further, the limited range may include a plurality of frequency ranges. For example, when a device which can be connected to the second device 200 includes a camera device and a display device as the first device 100, the manager may configure the limited range to include all of a frequency range (ex. 37 to 57 uF) based on a first reactance element value (ex. 47 uF) of the camera device and a frequency range (ex. 1 to 20 uF) based on a first reactance element value (ex. 10 uF) of the display device.

Subsequently, in the signal comparison operation S120, the second device 200 compares signals at both ends of the first resistance element 220.

More specifically, as illustrated in FIG. 2, the second device 200 may include the first comparator 240, and both input terminals of the first comparator 240 are connected to both ends of the first resistance element 220 and thus may compare and output the signals of the first resistance element 220.

The first comparator 250 may be a phase comparator configured to compare phases of signals at both ends of the first resistance element 220. Accordingly, the first controller 250 may measure a first frequency (=fC1) (for example, a frequency having a phase delay of 45 degrees or more) of a phase delay between signals at both ends of the first resistance element 220, the phase delay being out of a predetermined range according to an increase in the frequency of the first frequency generator 230, calculate an element value of the first reactance element 120 by using the first frequency (=fC1), and determine whether the first connection terminal 110 of the first device 100 is connected to the second connection terminal 210.

Figure 6A:
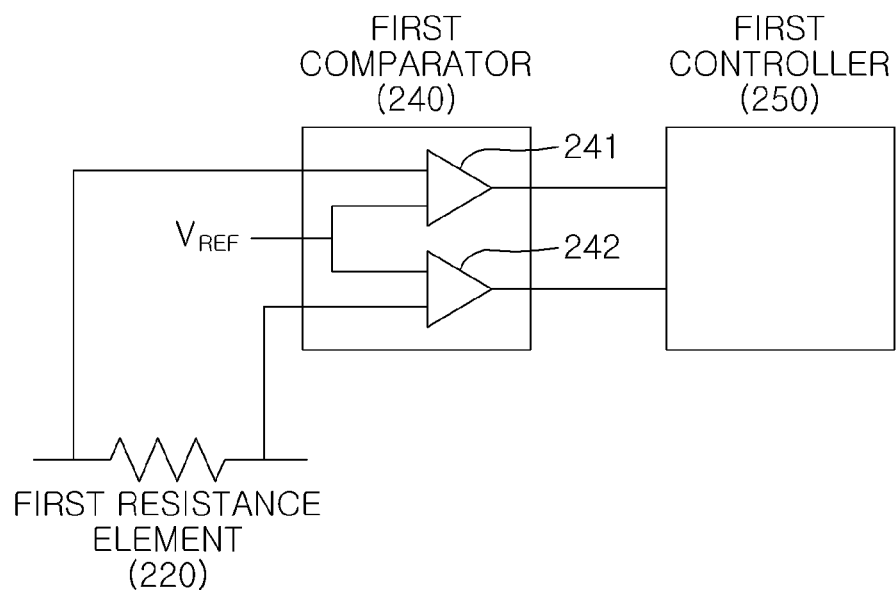
FIGS. 6A and 6B are schematic diagrams of a first comparator in the connection detection system according to an embodiment of the disclosure.
Figure 6B:
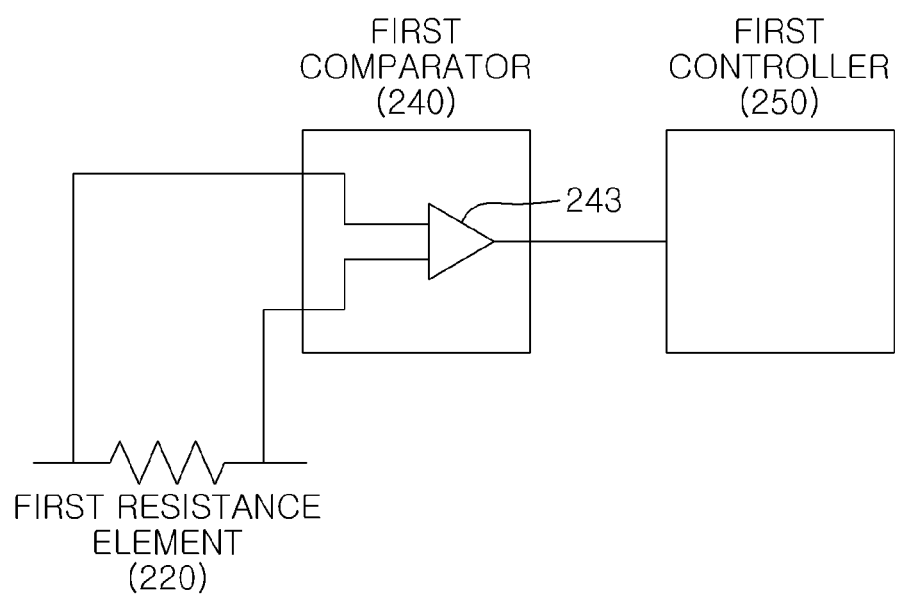
Figure 8A:
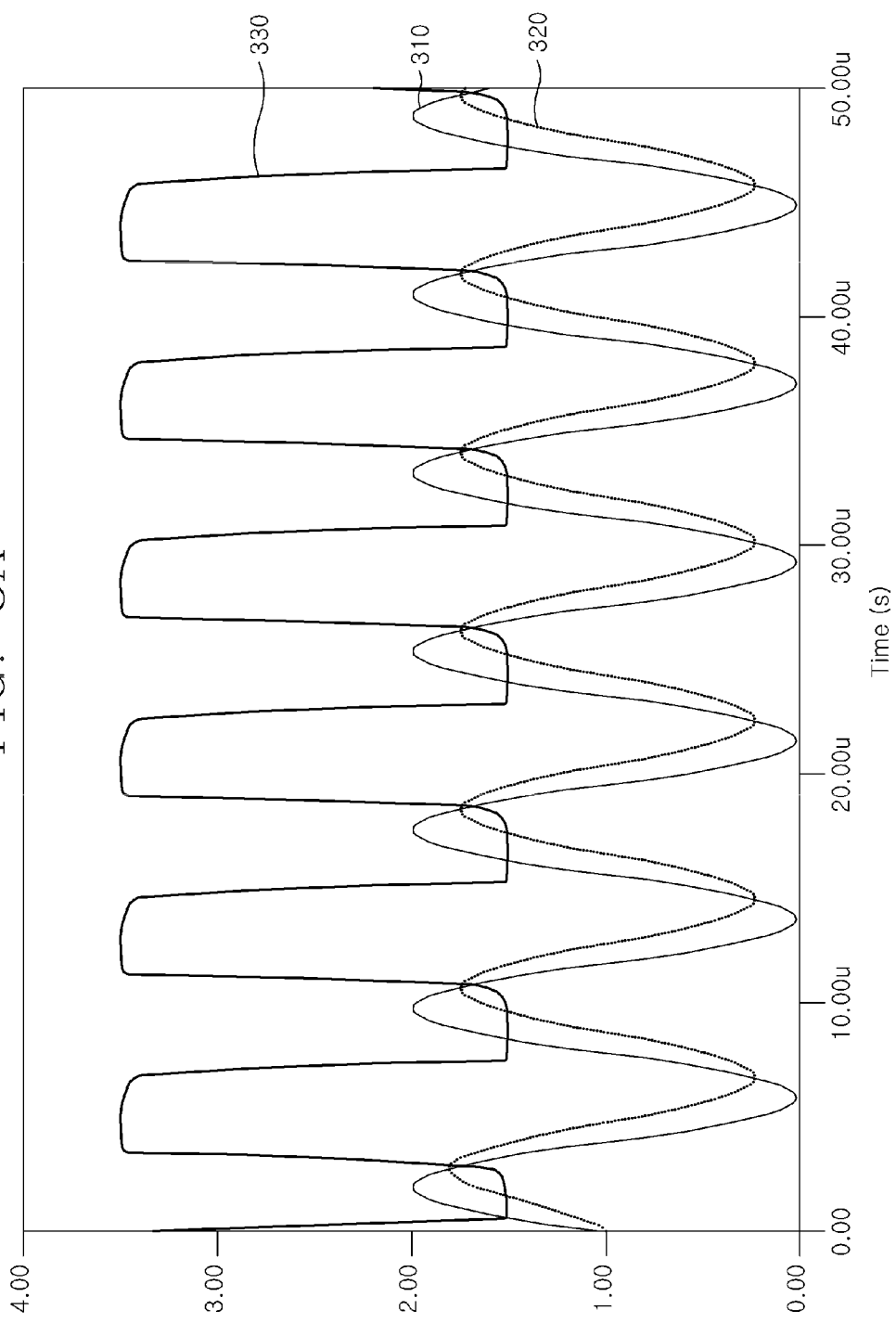
Figure 8B:
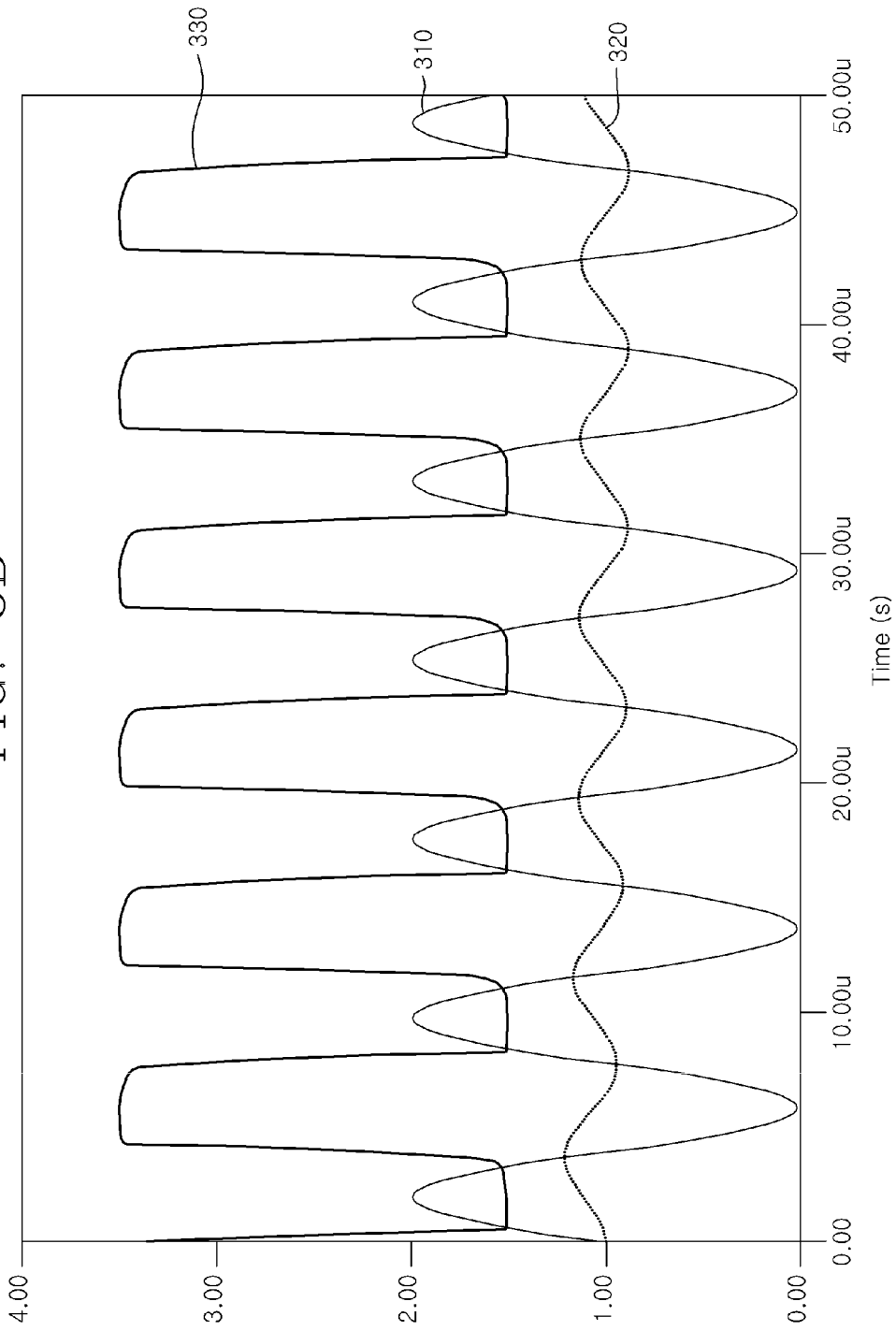

In a more detailed example, FIGS. 6A and 6B illustrate a detailed configuration of the first comparator 240 according to an embodiment of the disclosure.

First, as illustrated in FIG. 6A, the first comparator 240 may include a 1-1 comparator 241 configured to compare an original signal 310 generated by the first frequency generator 230 and applied to the first resistance element 220 and a preset reference signal 340 (VREF) and a 1-2 comparator 242 configured to compare a phase delay signal 320 having passed through the first resistance element 220 and the reference signal 340 (VREF) (first implementation example).

As illustrated in FIG. 6A, the reference signal 340 may be input into the second comparator 240, and the reference signal 340 may be determined as an intermediate value between the voltage upper limit and the voltage lower limit of the original signal 310 and the phase delay signal 320, but the disclosure is not necessarily limited thereto.

FIG. 7 illustrates a waveform in the first implementation example. More specifically, as illustrated in FIG. 7, the 1-1 comparator 241 may compare the original signal 310 and the reference signal 340 and measure first timing (T1 of FIG. 7) at which the original signal 310 and the reference signal 340 cross, and the 1-2 comparator 242 may compare the phase delay signal 320 and the reference signal 340 and measure second timing (T2 of FIG. 7) at which the phase delay signal 320 and the reference signal 340 cross.

Accordingly, the first controller 250 may detect a phase difference between the original signal 310 and the phase delay signal 320 on the basis of a difference between the first timing (T1) and the second timing (T2) and a cut-off frequency (fc) corresponding thereto, and thus may calculate an element value of the first reactance element 120.

Further, as illustrated in FIG. 6B, the first comparator 240 may include a 1-3 comparator 243 configured to compare the original signal 310 generated by the first frequency generator 230 and applied to the first resistance element 220 and the phase delay signal 320 having passed through the first resistance element 220 (second implementation example).

The 1-3 comparator 243 may compare the original signal 310 and the phase delay signal 320 and output a phase comparison signal 330, and the first controller 250 may calculate a phase delay of the phase delay signal 320 on the basis of the phase comparison signal 330.

In a more detailed example, FIGS. 8A to 8D illustrate the original signal 310 generated by the first frequency generator 230 and applied to the first resistance element 220, the phase delay signal 320 having passed through the first resistance element 220, and the phase comparison signal 330 output after the original signal 310 and the phase delay signal 320 are input into the first comparator 240.

As illustrated in FIGS. 8A to 8D, the phase comparison signal 330 has a high or low signal waveform based on a time point at which phases of the original signal 310 and the phase delay signal 320 cross.

Timing (phase) at which the phase comparison signal 330 varies and the phase difference between the original signal 310 and the phase delay signal 320 have one-to-one correspondence. The one-to-one correspondence relationship between two variables may be pre-stored in the form of an equation or a lookup table. The first controller 250 may acquire the phase difference between the original signal 310 and the phase delay signal 320 corresponding to timing at which the comparator output varies on the basis of the pre-stored one-to-one correspondence relationship between two variables.

Accordingly, the first controller 250 may measure a phase delay amount of the phase delay signal 320 according to a frequency increase based on the phase comparison signal 330 output from the first comparator 240 and detect a cut-off frequency (fc) and, accordingly, calculate the element value of the first reactance element 120.

Further, FIGS. 8A to 8D illustrate the case in which the cut-off frequency (fc) of the circuit is detected on the basis of the phase delay between the original signal 310, and the phase delay signal 320 and the element value of the first reactance element 120 is calculated using the same. The disclosure is not necessarily limited this, and the first comparator 240 may compare sizes of the signals at both ends of the first resistance element 220 and measure an attenuation level according to a frequency increase, and the first controller 250 may detect the cut-off frequency (fc) of the circuit on the basis thereof and calculate the element value of the first reaction element 120.

In the disclosure, the first controller 250 may perform a process of detecting a second frequency (=fc2) of a size change between the signals at both ends of the first resistance element 220, the size change being out of a predetermined range according to an increase of the frequency of the first frequency generator 230, and verifying whether the first frequency (=fc1) is accurate, so as to prevent an error of the cut-off frequency and more accurately calculate the element value of the first reactance element 120.

Although the first implementation example (FIG. 6A) and the second implementation example (FIG. 6B) have been described for the first comparator 240, the disclosure is not necessarily limited thereto, and the first comparator 240 can be variously configured to detect the phase difference between the original signal 310 and the phase delay signal 320.

Accordingly, in the operation S130 of determining whether there is the connection, the second device 200 determines whether the first connection terminal 110 of the first device 100 is connected to the second connection terminal 210 on the basis of the result of the signal comparison between both ends of the first resistance element 220.

More specifically, after detecting the first frequency (=fc1) of the phase delay between the signals at both ends of the first resistance element 220, the phase delay being out of the predetermined range, the first controller 250 may calculate the element value of the first reactance element 120 by using the first frequency (=fc1) and determine whether the first connection terminal 110 of the first device 100 is connected to the second connection terminal 210.

The first controller 250 may identify the first device 100 on the basis of the calculated element value of the first reactance element 120 and determine whether the first device 100 is a device allowed to be attached, so as to determine whether to allow the connection.

In the disclosure, the first connection terminal 110 may include the 1-3 contact point 113 and the second connection terminal 210 may include the 2-3 contact point 213 corresponding to the 1-3 contact point 113, in which case the first controller 250 may detect the connection between the first connection terminal 110 and the second connection terminal 210 and then perform control to apply power to the first device 100 through the 2-3 contact point 213.

In a more detailed example, when the element value of the first reactance element 120 is 47 uF, the first controller 250 may determine that a camera module device is attached, supply first power for driving the camera device, and transmit a signal for controlling the camera device.

Alternatively, when the element value of the first reactance element 120 is 10 uF, the first controller 250 may determine that a display module device is attached, supply second power for driving the display module device, and transmit a signal for controlling the display module device.

On the other hand, when the element value of the first reactance element 120 is 100 nF, the first controller 250 may determine that an unknown device is attached and block power without supplying the power to the device.

Further, in the system, the apparatus, and the method for detecting the connection according to an embodiment of the disclosure, the first device 100 may include a third connection terminal 190 including a 3-1 contact point 191 and a 3-2 contact point 192, a second resistance element 140, a second frequency generator 150 configured to apply a signal having a frequency varying in a predetermined range to a third device (not shown) through the third connection terminal 190 via the second resistance element 140, a second comparator 160 having both input terminals connected to both ends of the second resistance element 140 and configured to compare and output signals at both ends of the second resistance element 140, and a second controller 170 configured to determine whether a fourth connection terminal (not shown) of the third device is connected to the third connection terminal 190 on the basis of the output signal of the second comparator 160, as illustrated in FIG. 9.

The third connection terminal 190 may include a 3-3 contact point 193 and the fourth connection terminal (not shown) may include a 4-3 contact point (not shown) corresponding to the 3-3 contact point 193, and accordingly, the second controller 170 may detect the connection between the third connection terminal 190 and the fourth connection terminal and then perform control to apply power to the third device (not shown) through the 3-3 contact point 193.

Accordingly, in the system, the apparatus, and the method for detecting the connection according to an embodiment of the disclosure, when the third device (not shown) is attached to the first device 100 attached to the second device 200, the second controller 170 of the first device 100 may detect whether the third device is attached and also determine whether to supply power to the third device and to transmit a control signal or the like.

The second controller 170 may transmit information on a connection state of the third device to the second device 200 and allow the second device 200 to process power supply and control signal transmission in consideration of both the first device 100 and the third device.

In addition, in the system, the apparatus, and the method for detecting the connection according to an embodiment of the disclosure, the structure in which a plurality of devices are sequentially attached can be implemented as the third device detects whether a fourth device (not shown) is attached and processes power supply and control signal transmission to the fourth device.

Figure 10:
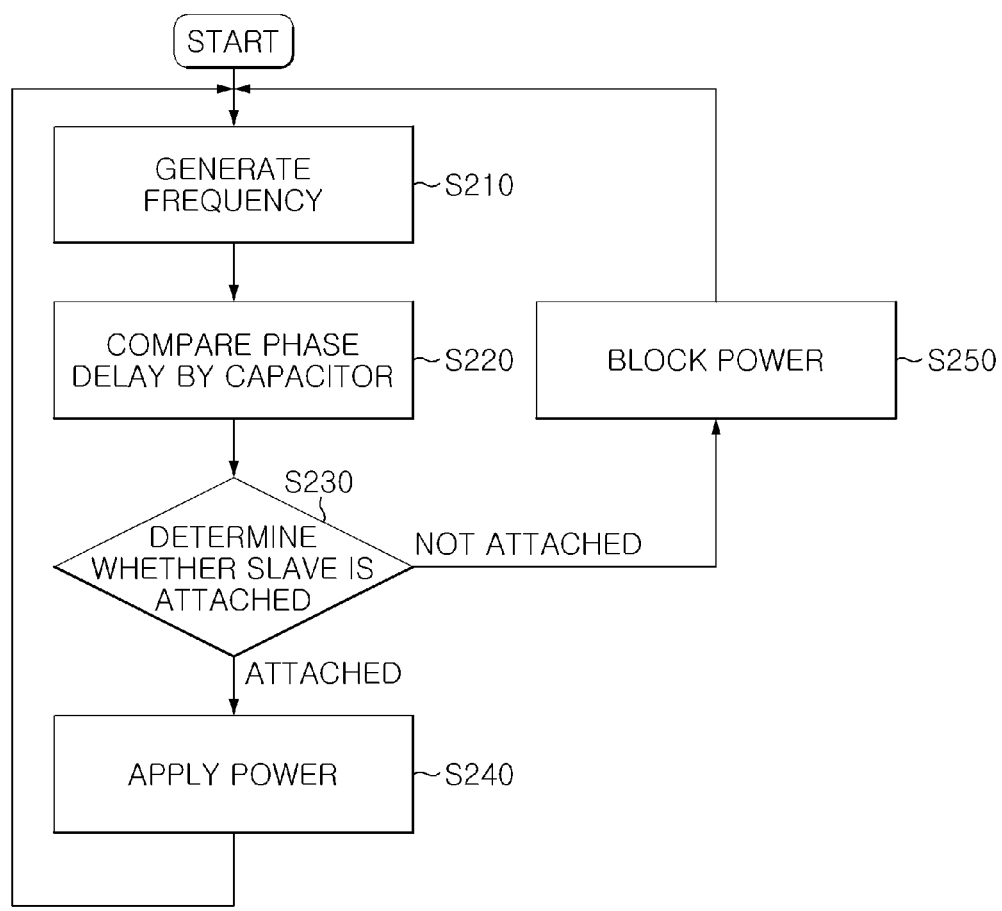
FIG. 10 is a detailed flowchart illustrating the connection detection method according to an embodiment of the disclosure.

FIG. 10 is a detailed flowchart illustrating a connection detection method according to an embodiment of the disclosure.

As illustrated in FIG. 10, first, in operation S210, the second device 200 generates a signal having a frequency varying in a predetermined range through the first frequency generator 230 and output the signal to the first resistance element 220.

At this time, the signal generated by the first frequency generator 230 configures a circuit passing through the first resistance element 220 and the first reactance element 120 such as a capacitor included in the first device 100.

Subsequently, in operation S220, the first comparator 240 of the second device 200 compares the signal generated by the first frequency generator 230 and a phase delay of a signal by the first reactance element 120 such as the capacitor.

Accordingly, in operation S230, the first controller 250 of the second device 200 measures a phase delay according to a change in a frequency of the signal, calculates a capacitance value of the first reactance element 120, and then determines whether the first device 100 such as a slave device is attached on the basis of the calculated capacitance value of the first reactance element 120.

At this time, the first controller 250 applies power to the first device 100 to drive the first device 100 when the calculated capacitance value is appropriate, and blocks power to the first device 100 when the calculated capacitance value is inappropriate and it is determined that the first device 100 is not attached.

Figure 11:
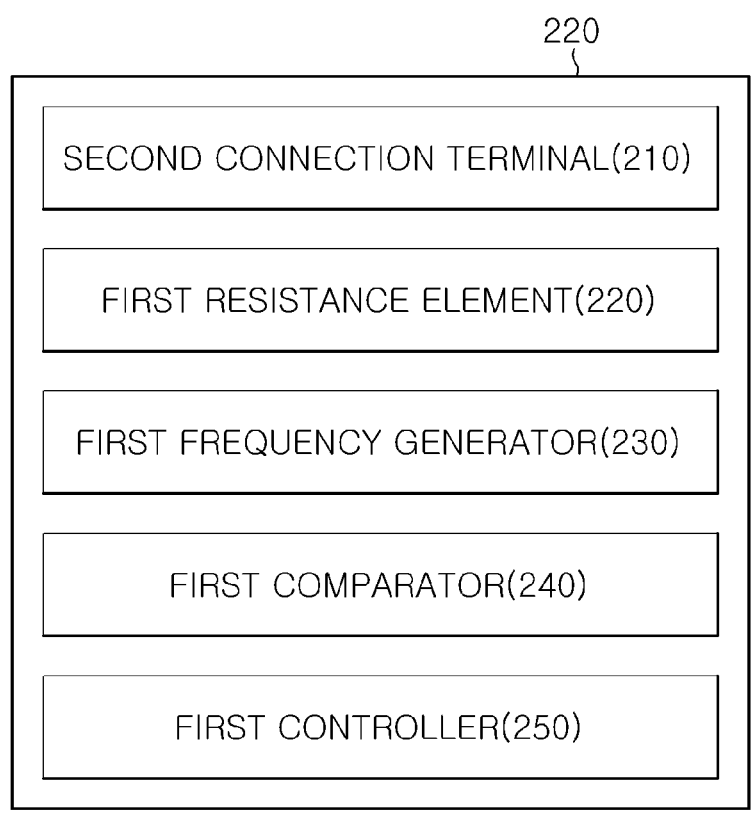
FIG. 11 is a block diagram illustrating the connection detection device according to an embodiment of the disclosure.

FIG. 11 is block diagram illustrating the connection detection device 200 according to an embodiment of the disclosure.

As illustrated in FIG. 11, the connection detection device 200 according to an embodiment of the disclosure may include the second connection terminal 210, the first resistance element 220, the first frequency generator 230, the first comparator 240, and the first controller 250.

Hereinafter, the connection detection device 200 according to an embodiment of the disclosure is separately described for each element. Further, a detailed description of the connection detection device 200 according to an embodiment of the disclosure can be implemented by various embodiments similar to the connection detection system 10 and method according to an embodiment of the disclosure in FIGS. 1 to 10 described above, and thus a duplicated description is omitted.

First, the connection detection device 200 is configured to detect whether there is a connection with the first device 100, which includes the first connection terminal 110 including the 1-1 contact point 111 and the 1-2 contact point 112 and the first reactance element 120 connected to the first connection terminal 110. The connection detection device 200 includes the second connection terminal 210 including the 2-1 contact point 211 and the 2-2 contact point 212 corresponding to the 1-1 contact point 111 and the 1-2 contact point 112 and the first resistance element 220.

The first frequency generator 230 applies a signal having a frequency varying in a predetermined range to the first device 100 through the second connection terminal 210 via the first resistance element 220.

The first comparator 240 has both input terminals connected to both ends of the first resistance element 220 and compares and outputs signals at both ends of the first resistance element 220.

The first controller 250 determines whether the first connection terminal 110 of the first device 100 is connected to the second connection terminal 210 on the basis of the output signal of the first comparator 240.

The first comparator 240 may be a phase comparator configured to compare phases of the signals at both ends of the first resistance element 220 in which case the first controller 250 may detect a first frequency (=fc1) of a phase delay between the signals at both ends of the first resistance element 220 by using the output signal of the phase comparator, the phase delay being out of a predetermined range according to an increase in the frequency of the first frequency generator 230, calculate an element value of the first reactance element 120 by using the first frequency (=fc1), and determine whether the first connection terminal 110 of the first device 100 is connected to the second connection terminal 210.

The first controller 250 may detect a second frequency (=fc2) of a size change between the signals at both ends of the first resistance element 220, the size change being output of a predetermined range according to an increase in the frequency of the first frequency generator 230, and verify whether the first frequency (=fc1) is accurate by using the second frequency (=fc2).

The first connection terminal 110 may include the 1-3 contact point 113 and the second connection terminal 210 may include the 2-3 contact point 213 corresponding to the 1-3 contact point 113, and accordingly, the first controller 250 may detect the connection between the first connection terminal 110 and the second connection terminal 210 and then perform control to apply power to the first device 100 through the 2-3 contact point 213.

The first frequency generator 230 may apply the signal while changing the frequency in a limited range on the basis of a predicted value of the first frequency (=fC1) according to the first reactance element 120.

Accordingly, in the system, the apparatus, and the method for detecting the connection according to an embodiment of the disclosure, when the first device 100 is connected to the second device 200, the second device 200 may accurately detect whether the first device 100 is connected thereto and stably supply power and signals required for the operation of the first device 100, and the second device 200 may identify the connected first device 100 and allow the connection only for the first device 100 allowed to be connected.

Although the embodiments of the disclosure have been described for illustrative purposes, those skilled in the art will appreciate that various modifications, additions, and substitutions are possible, without departing from the scope and spirit of the disclosure. Accordingly, embodiments of the disclosure are to describe the technical idea of the disclosure without limiting the same, and the disclosure is not limited to the embodiments. The protection scope of the disclosure should be interpreted by the claims, and all technical ideas within a range equivalent thereto should be construed as being included in the claims of the disclosure.

The invention claimed is:

1. A system for detecting a connection, comprising:
a first device including a first connection terminal having a 1-1 contact point and a 1-2 contact point and a first reactance element connected to the first connection terminal; and
a second device including,
a second connection terminal having a 2-1 contact point and a 2-2 contact point corresponding to the 1-1 contact point and the 1-2 contact point,
a first resistance element,
a first frequency generator connected to a first end of the first resistance element and configured to apply a signal having a frequency varying a predetermined range to the first device through the second connection terminal via the first end of the first resistance element, a second end of the first resistance element being connected to the second connection terminal,
a first comparator having a first input terminal connected to the first end of the first resistance element and a second input terminal connected to the second end of the first resistance element and configured to compare signals at the first end and the second end of the first resistance element, and a first controller configured to determine whether the first connection terminal is connected to the second connection terminal by using an output signal of the first comparator.

2. The system of claim 1, wherein the first comparator is a phase comparator configured to compare phases of the signals at the first end and the second end of the first resistance element, and
the first controller is configured to detect a first frequency of a phase delay between the first end and the second end of the first resistance element by using an output signal of the phase comparator, the phase delay being out of a predetermined range according to an increase in the frequency of the first frequency generator, and calculate an element value of the first reactance element by using the first frequency and determine whether the first connection terminal of the first device is connected to the second connection terminal.

3. The system of claim 2, wherein the first controller is configured to detect a second frequency of a size change between the signals at the first end and the second end of the first resistance element, the size change being output of a predetermined range according to an increase in the frequency of the first frequency generator, and
verify whether the first frequency is accurate by using the second frequency.

4. The system of claim 1, wherein the first connection terminal comprises a 1-3 contact point,
the second connection terminal comprises a 2-3 contact point corresponding to the 1-3 contact point, and
the first controller is configured to detect the connection between the first connection terminal and the second connection terminal and then perform control to apply power to the first device through the 2-3 contact point.

5. The system of claim 2, wherein the first frequency generator is configured to apply the signal while changing the frequency within the predetermined range, based on a predicated value of the first frequency according to the first reactance element.

6. The system of claim 1, wherein the first device comprises a third connection terminal having a 3-1 contact point and a 3-2 contact point,
a second resistance element,
a second frequency generator configured to apply a signal having a frequency varying in a predetermined range to a third device through the third connection terminal via the second resistance element,
a second comparator having both input terminals connected to both ends of the second resistance element and configured to compare and signals at both ends of the second resistance element, and
a second controller configured to determine whether a fourth connection terminal of the third device is connected to the third connection terminal by using an output signal of the second comparator.

7. The system of claim 6, wherein the third connection terminal has a 3-3 contact point, and
the second controller is configured to detect the connection between the third connection terminal and the fourth connection terminal and then perform control to apply power to the third device through the 3-3 contact point.

8. An apparatus for detecting a connection to detect whether there is a connection with a first device having a first connection terminal including a 1-1 contact point and a 1-2 contact point and a first reactance element connected to the first connection terminal, the apparatus comprising:

a second connection terminal having a 2-1 contact point and a 2-2 contact point corresponding to the 1-1 contact point and the 1-2 contact point;

a first resistance element;

a first frequency generator connected to a first end of the first resistance element and configured to apply a signal having a frequency varying in a predetermined range to the first device through the second connection terminal via the first end of the first resistance element, wherein a second end of the first resistance element is connected to the second connection terminal;

a first comparator having a first input terminal connected to the first end of the first resistance element and a second input terminal connected to the second end of the first resistance element and configured to compare signals at the first end and the second end of the first resistance element, and a first controller configured to determine whether the first connection terminal of the first device is connected to the second connection terminal by using an output signal of the first comparator.

9. A method of detecting a connection by which a second device detects whether there is a connection with a first device, the first device including a first connection terminal having a 1-1 contact point and a 1-2 contact point and a first reactance element connected to the first connection terminal, the method comprising:

a signal application operation in which the second device generates, using a first frequency generator connected to a first end of a first resistance element, a signal having a frequency varying in a predetermined range and applies the signal to the first device through a second connection terminal having a 2-1 contact point and a 2-2 contact point corresponding to the 1-1 contact point and the 1-2 contact point via the first end of the first resistance element, a second end of the first resistance element being connected to the 2-1 contact point or the 2-2 contact point;

a signal comparison operation in which the second device compares signals at the first end and the second end of the first resistance element; and a connection determination operation in which the second device determines whether the first connection terminal of the first device is connected to the second connection terminal by using a result of the comparison between the signals at the first end and the second end of the first resistance element.

* * * * *

UNITED STATES PATENT AND TRADEMARK OFFICE
CERTIFICATE OF CORRECTION

| | |
|---|---|
| PATENT NO. | : 12,000,907 B2 |
| APPLICATION NO. | : 17/817432 |
| DATED | : June 4, 2024 |
| INVENTOR(S) | : Sungyong Chung et al. |

It is certified that error appears in the above-identified patent and that said Letters Patent is hereby corrected as shown below:

On the Title Page

Under (72), second inventor Jaeryang Lee, delete "(JP)" and insert --(KR)--.

Signed and Sealed this
Sixteenth Day of July, 2024

Katherine Kelly Vidal
*Director of the United States Patent and Trademark Office*